(12) United States Patent
Cui et al.

(10) Patent No.: US 10,300,688 B2
(45) Date of Patent: May 28, 2019

(54) ENCAPSULATION METHOD AND ENCAPSULATION DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fuyi Cui, Beijing (CN); Xu Chen, Beijing (CN); Quanqin Sun, Beijing (CN); Zhiqiang Gao, Beijing (CN); Jingjing Chen, Beijing (CN)

(73) Assignees: BOE TECHNOLOGY GROUP CO., LTD., Beijing (CN); ORDOS YUANSHENG OPTOELECTRONCIS CO., LTD., Ordos, Inner Mongolia (CN)

( * ) Notice: Subject to any disclaimer, the term of this patent is extended or adjusted under 35 U.S.C. 154(b) by 269 days.

(21) Appl. No.: 15/233,048

(22) Filed: Aug. 10, 2016

(65) Prior Publication Data
US 2017/0266940 A1 Sep. 21, 2017

(30) Foreign Application Priority Data
Mar. 18, 2016 (CN) .......................... 2016 1 0159008

(51) Int. Cl.
| | |
|---|---|
| *B32B 37/02* | (2006.01) |
| *B32B 37/10* | (2006.01) |
| *B32B 37/12* | (2006.01) |
| *B32B 37/26* | (2006.01) |
| *B32B 38/00* | (2006.01) |
| *H01L 21/56* | (2006.01) |
| *H01L 27/32* | (2006.01) |
| *H01L 51/52* | (2006.01) |

(52) U.S. Cl.
CPC .............. *B32B 37/02* (2013.01); *B32B 37/10* (2013.01); *B32B 37/12* (2013.01); *B32B 37/26* (2013.01); *B32B 38/0036* (2013.01); *B32B 2307/20* (2013.01); *B32B 2307/40* (2013.01); *B32B 2309/12* (2013.01); *B32B 2457/20* (2013.01); *H01L 21/568* (2013.01); *H01L 27/32* (2013.01); *H01L 51/5246* (2013.01); *H01L 2251/56* (2013.01)

(58) Field of Classification Search
CPC ........... H01L 51/5246; H01L 51/50–56; H01L 27/32–3297; H01L 2251/56; H01L 21/568; B32B 2457/20; B32B 2457/206
See application file for complete search history.

(56) References Cited

U.S. PATENT DOCUMENTS

2016/0225800 A1* 8/2016 Jiang ................... H01L 51/5246
2016/0365535 A1* 12/2016 Jiang ...................... H01L 51/56

FOREIGN PATENT DOCUMENTS

JP 2010118218 A * 5/2010 ......... H01L 51/5246

* cited by examiner

*Primary Examiner* — Carson Gross
(74) *Attorney, Agent, or Firm* — Ladas & Parry LLP

(57) ABSTRACT

An encapsulation method and an encapsulation device are provided. The encapsulation method comprises: forming a binding agent in an encapsulation region of a display substrate; forming an organic thin film on the binding agent; exerting a pressure on the organic thin film and the binding agent by using a pressure exerting device, wherein the organic thin film is not bound to the pressure exerting device; removing the organic thin film; and providing a cover plate on the binding agent and binding the cover plate with the display substrate by the binding agent.

8 Claims, 3 Drawing Sheets

ENCAPSULATION METHOD AND ENCAPSULATION DEVICE

TECHNICAL FIELD

Embodiments of the present disclosure relate to an encapsulation method and an encapsulation device.

BACKGROUND

In an encapsulation process, a binding agent (such as glass cement) is generally adopted to bind a cover plate and a display substrate. The binding agent is generally formed in an encapsulation region of the display substrate by a printing (such as silk-screen printing) process, then the cover plate is placed on the binding agent so that encapsulation is completed and a display panel comprising the cover plate and the display substrate is obtained.

Because of the drawbacks of the printing technology per se, the binding agent is not flat at an interface of the binding agent and the display substrate. As show in FIG. 1, poor encapsulation is caused, and thus Newton rings and other display defects are likely to occur in the encapsulation region in a display period of the display panel.

SUMMARY

According to embodiments of the disclosure, an encapsulation method is provided. The method comprises: forming a binding agent in an encapsulation region of a display substrate; forming an organic thin film on the binding agent; exerting a pressure on the organic thin film and the binding agent by using a pressure exerting device, wherein the organic thin film is not bound to the pressure exerting device; removing the organic thin film; and providing a cover plate on the binding agent and binding the cover plate with the display substrate by the binding agent.

For example, the removing the organic thin film includes: heating the organic thin film so as to gasify the organic thin film.

For example, before the providing the cover plate on the binding agent, the method further comprises: fusing the binding agent.

For example, a temperature of heating the organic thin film is 400° C. to 600° C.

For example, the binding agent includes a glass cement.

For example, a thickness of the organic thin film is 1 micron to 3 microns.

For example, the organic thin film is not bound to the pressure exerting device, which means: a binding strength between the organic thin film and the pressure exerting device is smaller than a binding strength between the organic thin film and the binding agent.

According to the embodiments of the disclosure, an encapsulation device is provided. The encapsulation device comprises: a first forming unit, configured to form a binding agent in an encapsulation region of a display substrate; a second forming unit, configured to form an organic thin film on the binding agent; a pressure exerting unit, configured to exert a pressure on the organic thin film and the binding agent, wherein the organic thin film is not bound to the pressure exerting unit; a removing unit, configured to remove the organic thin film; and a providing unit, configured to provide a cover plate on the binding agent so that the cover plate and the display substrate are bound with each other by the binding agent.

For example, the removing unit is configured to heat the organic thin film so as to gasify the organic thin film.

For example, the removing unit is further configured to at least partially solidify the binding agent during heating the organic thin film.

For example, the removing unit is further configured to heat the binding agent after removing the organic thin film so as to fuse the binding agent.

For example, the pressure exerting unit includes: a platform and/or a roller.

For example, the organic thin film is not bound to the pressure exerting unit, which means: a binding strength between the organic thin film and the pressure exerting unit is smaller than a binding strength between the organic thin film and the binding agent.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
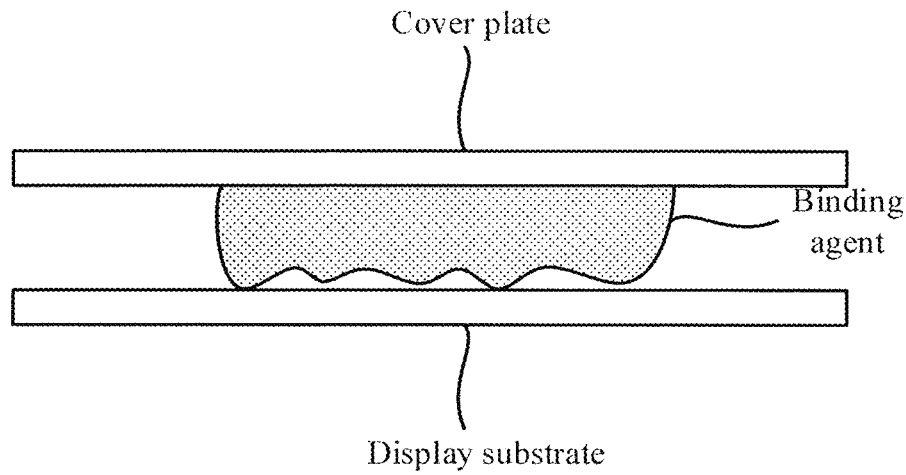
FIG. 1 is a schematic view illustrating a binding agent according to one technique.
Figure 2:
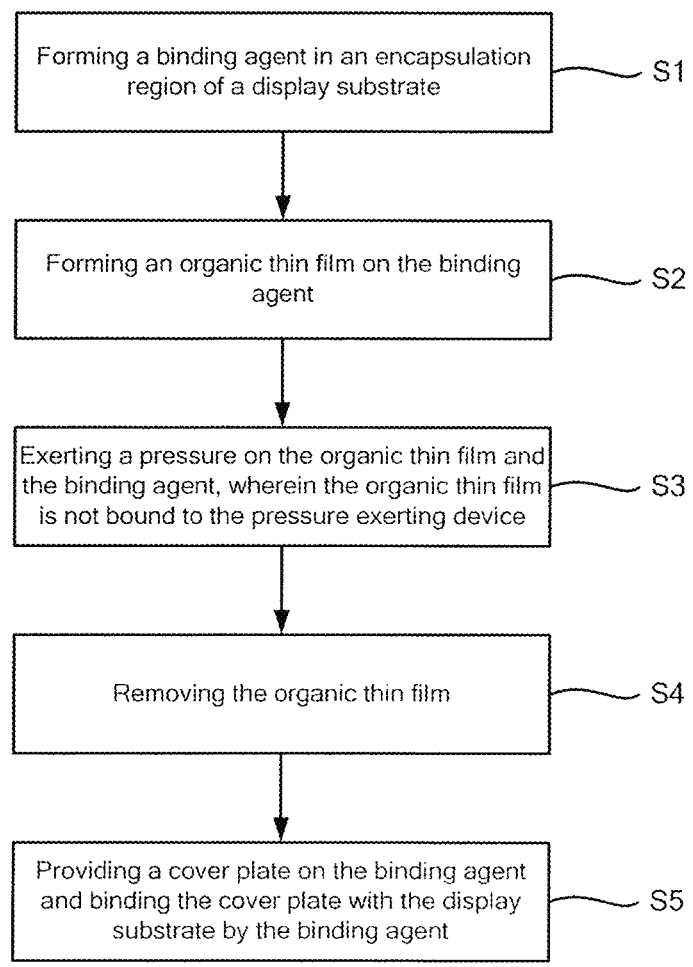
FIG. 2 is a flow chart illustrating an encapsulation method according to embodiments of the present disclosure.
Figure 3:
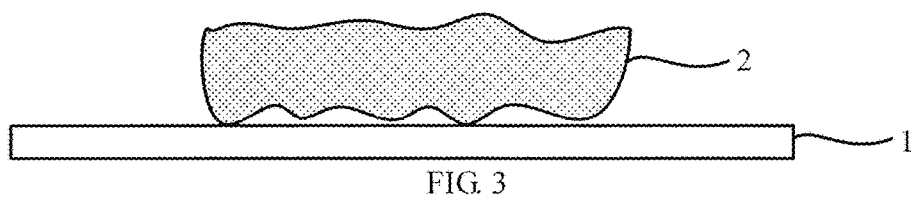
FIGS. 3 to 9 are structural schematic views illustrating the encapsulation method according to the embodiments of the present disclosure.

As shown in FIG. 2, embodiments of the present disclosure provide an encapsulation method, and the method includes:

S1: forming a binding agent 2 in an encapsulation region of a display substrate 1, as shown in FIG. 3.

For example, the display substrate includes the encapsulation region and a display region, and the encapsulation region is located outside the display region and surrounds the display region.

Figure 4:
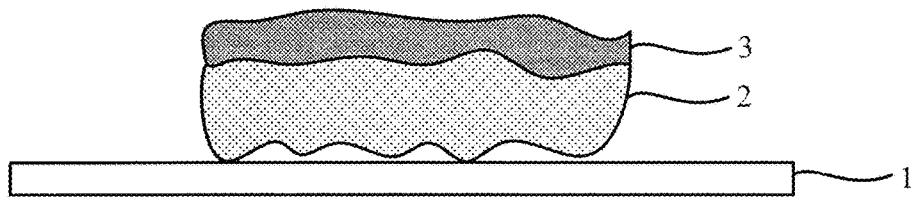

S2: forming an organic thin film 3 on the binding agent 2, as shown in FIG. 4.

For example, the organic thin film 3 is only located on the binding agent 2, that is, the organic thin film 3 is only located in the encapsulation region. For example, the organic thin film 3 is formed both in the encapsulation region and the display region so as to simplify the process of forming the organic thin film 3. For example, for a display motherboard (including a plurality of display substrates 1), the organic thin film 3 is formed on the whole display motherboard, so that the binding agent 2 formed on display motherboard comprising the plurality of display substrates 1 are pressed to be flat as a whole and uniformity of flatness of the binding agent 2 on the plurality of display substrates 1 is guaranteed, and the encapsulation process is simplified.

Figure 5:
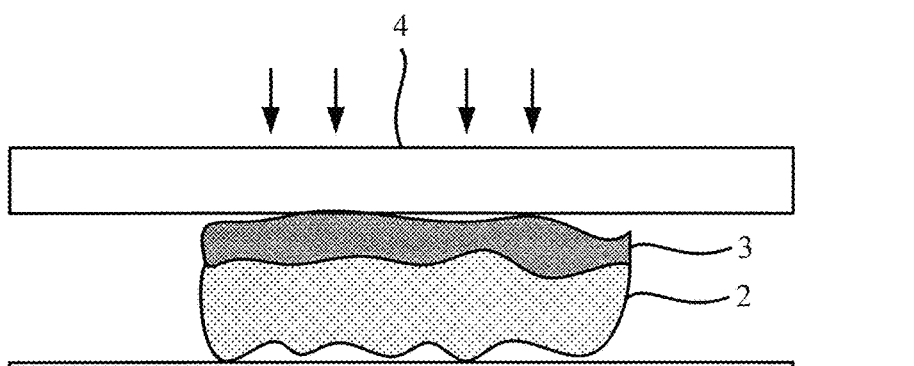
Figure 6:
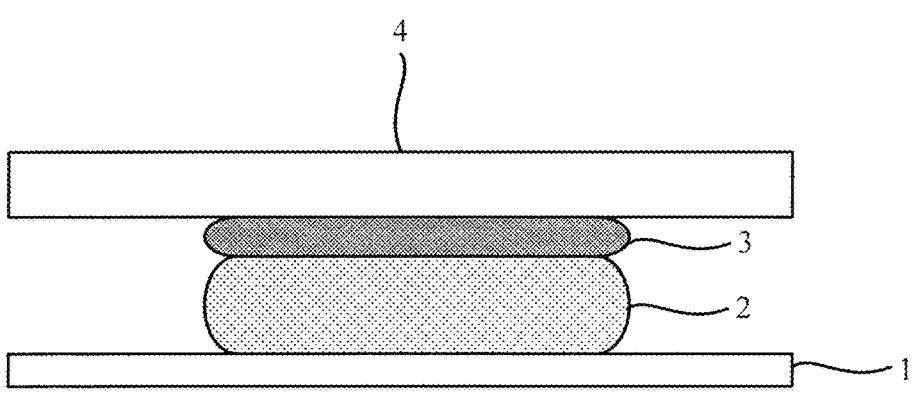

S3: exerting a pressure on the organic thin film 3 and the binding agent 2, as shown in FIG. 5 and FIG. 6.

Figure 7:
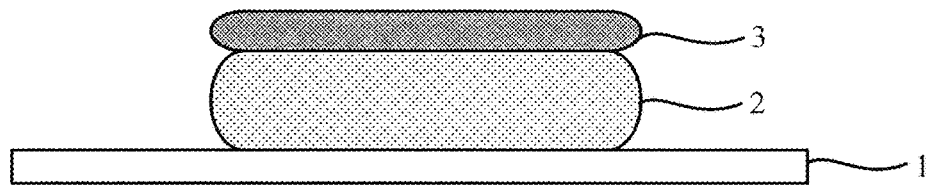

For example, the organic thin film 3 and the binding agent 2 are pressed to be flat by using a pressure exerting device 4. For example, the organic thin film 3 is not bound to the pressure exerting device 4 (it should be understood that, because the organic thin film is sticky more or less, the organic thin film being not bound to the pressure exerting device actually refers to that a binding strength between the organic thin film 3 and the pressure exerting device 4 is smaller than a binding strength between the organic thin film 3 and the binding agent 2); and therefore, in the case that the pressure exerting device 4 is removed from the organic thin film 3, the organic thin film 3 is not be stuck away from the display substrate, and further the binding agent 2 is not stuck away from the substrate, thereby ensuring that an interface of the binding agent 2 and the display substrate 1 is kept flat, as shown in FIG. 7.

Figure 8:
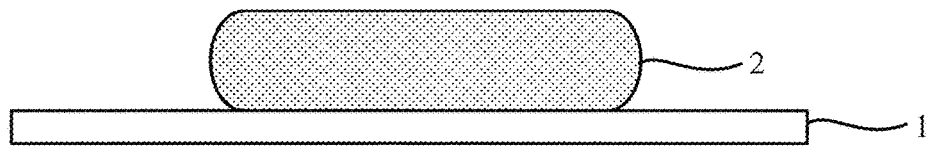

S4: removing the organic thin film 3, as shown in FIG. 8.

Figure 9:
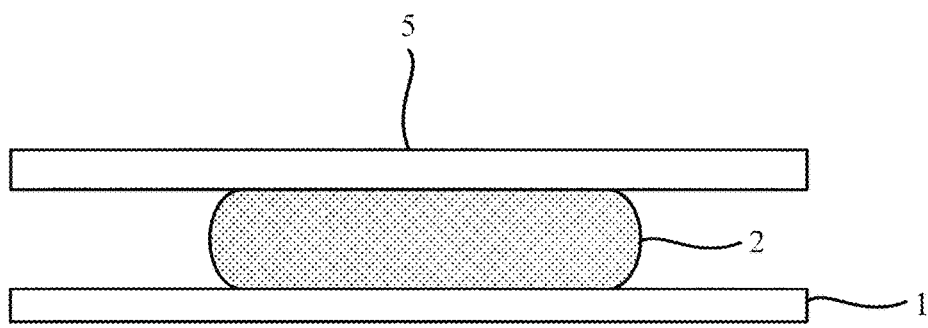

S5: providing a cover plate 5 on the binding agent 2, and binding the cover plate 5 with the display substrate 1 by the binding agent 2, as shown in FIG. 9.

According to the embodiments of the present disclosure, the organic thin film is formed on the binding agent after the binding agent is formed, and further the pressure is exerted on the binding agent through the organic thin film, so that the interface of the binding agent and the display substrate becomes flat, thereby ensuring a good encapsulation effect and avoiding Newton rings and other display defects in the encapsulation region in a subsequent display process. Besides, because the organic thin film is not bound to the pressure exerting device, the organic thin film will not be bound to the pressure exerting device in the case that the pressure exerting device removes from the organic thin film after the pressure is exerted on the binding agent through the organic thin film, and therefore the pressure exerting device will not be contaminated, and the case that the binding agent is not flat because the binding agent is stuck away from the display substrate by the organic thin film is avoided.

For example, the removing the organic thin film includes: heating the organic thin film so as to gasify the organic thin film.

Because the organic thin film generally is a hydrocarbon compound, the organic thin film will be gasified into vapor, carbon dioxide and other gases to expose the binding agent in the case that the organic thin film is heated. After the organic thin film is removed, the cover plate is placed on the binding agent and the cover plate and the display substrate are bound with each other by the binding agent.

For example, before providing the cover plate on the binding agent, the method further includes: fusing the binding agent.

The binding agent is also heated in the case that the organic thin film is heated; in this case, the binding agent is likely to be solidified and thus lose stickiness. In the embodiments of the present disclosure, after heating and removing the organic thin film and before providing the cover plate, the binding agent becomes sticky again by fusing the binding agent (for example by laser fusing), and therefore the binding agent is capable of binding the cover plate and the display substrate together.

For example, a temperature of heating the organic thin film ranges from 400° C. to 600° C. Within the temperature range, it is guaranteed that the organic thin film is totally gasified, and the organic thin film will not be remained on the binding agent, and a binding capacity of an upper surface of the binding agent is guaranteed.

For example, the binding agent includes: a glass cement.

For example, a thickness of the organic thin film ranges from 1 micron to 3 microns. Within the thickness range, it is guaranteed that the organic thin film is totally gasified in the heating process.

By using the encapsulation method provided by the embodiments of the present disclosure, the cover plate and the display substrate are bound with each other to form the display panel. It should be understood that, the display panel encapsulated by using the method provided by the embodiments of the present disclosure for example is used for the following display devices: an electronic paper, a mobile phone, a tablet personal computer, a TV set, a notebook computer, a digital photo frame, a navigation instrument or any other product or component with a display function.

Figure 10:
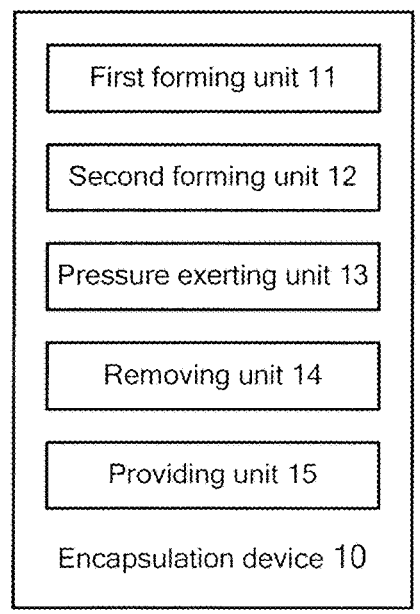
FIG. 10 is schematic view illustrating an encapsulation device according to the embodiments of the present disclosure.

As show in FIG. 10, the embodiments of the present disclosure provide an encapsulation device 10, and the encapsulation device 10 includes:

A first forming unit 11, configured to form a binding agent in an encapsulation region of a display substrate;

A second forming unit 12, configured to form an organic thin film on the binding agent;

A pressure exerting unit 13, configured to exert a pressure on the organic thin film and the binding agent, wherein the organic thin film is not bound to the pressure exerting unit 13;

A removing unit 14, configured to remove the organic thin film; and

A providing unit 15, configured to provide a cover plate on the binding agent so that the cover plate and the display substrate are bound with each other by the binding agent.

For example, the first forming unit 11 is a printing device, a spray coating device and the like.

For example, the second forming unit 12 is a printing device, a spray coating device and the like.

For example, the pressure exerting unit 13 includes: a platform and/or a roller.

For example, the removing unit 14 is configured as a heating device for heating the organic thin film so as to gasify the organic thin film.

For example, the removing unit 14 is further configured to at least partially solidify the binding agent during heating the organic thin film.

For example, the removing unit 14 is further configured to heat the binding agent after removing the organic thin film so as to fuse the binding agent.

For example, the providing unit 15 is configured as a transfer device for placing the cover plate on the binding agent.

For example, the providing unit 15 is further configured to press the cover plate to the binding agent after placing the cover plate on the binding agent.

For example, a forming process adopted in the above steps includes: deposition, sputtering and other film-forming processes; and etching and other patterning processes.

In the embodiments of the present disclosure, the organic thin film is formed on the binding agent after the binding agent is formed, and further the pressure is exerted on the binding agent through the organic thin film, so that the interface of the binding agent and the display substrate becomes flat, thereby ensuring a good encapsulation effect and avoiding Newton rings and other display defects in the encapsulation region in the display process. Besides, because the organic thin film is not bound to the pressure exerting device, the organic thin film will not be bound to the pressure exerting device in the case that the pressure exerting device removes from the organic thin film after the pressure is exerted on the binding agent through the organic thin film, and therefore the pressure exerting device will not be contaminated, and the case that the binding agent is not flat because the binding agent is stuck away from the display substrate by the organic thin film is avoided.

It should be understood that, in the drawings, a size of a layer and a size of a region may be overstated in order to make graphical representation clear. It can be understood that, in the case that an element or a layer is referred to as "above" another element or layer, the element or the layer can be directly arranged on other elements, or a middle layer can exist. Besides, it can be understood that, in the case that an element or a layer is referred to as "below" another element or layer, the element or the layer can be directly arranged below other elements, or one or more middle layers or elements can exist. In addition, it can also be understood that, in the case that a layer or an element is referred to as "between" two layers or two elements, the layer or the element can be a unique layer between the two layers or the two elements, or one or more middle layers or elements can exist. Similar reference signs indicate similar elements in the whole description.

In the embodiments of the present disclosure, terms such as "first" and "second" are only used for a purpose of description and cannot be used for indicating or implying relative importance. A term a plurality of refers to two or more, unless otherwise specified.

The foregoing embodiments merely are exemplary embodiments of the disclosure, and not intended to define the scope of the disclosure, and the scope of the disclosure is determined by the appended claims.

The present application claims priority of Chinese Patent Application No. 201610159008.1 filed on Mar. 18, 2016, the present disclosure of which is incorporated herein by reference in its entirety as part of the present application.

The invention claimed is:

1. An encapsulation method, comprising:
   forming a binding agent in an encapsulation region of a display substrate;
   forming an organic thin film on the binding agent;
   exerting a pressure on the organic thin film and the binding agent by using a pressure exerting device, wherein the organic thin film is not bound to the pressure exerting device;
   removing the organic thin film; and
   providing a cover plate on the binding agent and binding the cover plate with the display substrate by the binding agent;
   wherein the removing the organic thin film comprises: heating the organic thin film so as to gasify the organic thin film.

2. The encapsulation method according to claim 1, wherein, before the providing the cover plate on the binding agent, the method further comprises: fusing the binding agent.

3. The encapsulation method according to claim 1, wherein, a temperature of heating the organic thin film is 400° C. to 600° C.

4. The encapsulation method according to claim 1, wherein, the binding agent includes a glass cement.

5. The encapsulation method according to claim 1, wherein, a thickness of the organic thin film is 1 micron to 3 microns.

6. The encapsulation method according to claim 1, wherein, the organic thin film is not bound to the pressure exerting device, which means: a binding strength between the organic thin film and the pressure exerting device is smaller than a binding strength between the organic thin film and the binding agent.

7. The encapsulation method according to claim 1, further comprising: at least partially solidifying the binding agent during heating the organic thin film.

8. The encapsulation method according to claim 1, further comprising: heating the binding agent after removing the organic thin film so as to fuse the binding agent.

* * * * *